(12) United States Patent
Wang et al.

(10) Patent No.: US 9,991,884 B2
(45) Date of Patent: *Jun. 5, 2018

(54) SWITCHING CIRCUITS HAVING FERRITE BEADS

(71) Applicant: Transphorm Inc., Goleta, CA (US)

(72) Inventors: Zhan Wang, Goleta, CA (US); Yifeng Wu, Goleta, CA (US); James Honea, Santa Barbara, CA (US)

(73) Assignee: Transphorm Inc., Goleta, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/491,920

(22) Filed: Apr. 19, 2017

(65) Prior Publication Data

US 2017/0222640 A1 Aug. 3, 2017

Related U.S. Application Data

(60) Continuation of application No. 15/363,987, filed on Nov. 29, 2016, now Pat. No. 9,660,640, which is a (Continued)

(51) Int. Cl.
*H03B 1/00* (2006.01)
*H03K 3/00* (2006.01)
(Continued)

(52) U.S. Cl.
CPC ..... *H03K 17/162* (2013.01); *H01L 23/49562* (2013.01); *H01L 23/552* (2013.01);
(Continued)

(58) Field of Classification Search
CPC . H01L 29/2003; H01L 29/16; H01L 27/0883; H01L 27/088; H03K 17/17; H03K 3/012
(Continued)

(56) References Cited

U.S. PATENT DOCUMENTS

| 4,321,489 A | 3/1982 | Higuchi et al. |
| 4,384,287 A | 5/1983 | Sakuma |

(Continued)

FOREIGN PATENT DOCUMENTS

| CN | 1921148 | 2/2007 |
| CN | 101978589 | 2/2011 |

(Continued)

OTHER PUBLICATIONS

Authorized officer Keon Hyeong Kim, International Search Report and Written Opinion in PCT/US2008/076160 dated Mar. 18, 2009, 11 pages.
(Continued)

*Primary Examiner* — Thomas Skibinski
(74) *Attorney, Agent, or Firm* — Fish & Richardson P.C.

(57) ABSTRACT

A circuit includes an electronic component package that comprises at least a first lead, a III-N device in the electronic component package, a gate driver, and a ferrite bead. The III-N device comprises a drain, gate, and source, where the source is coupled to the first lead. The gate driver comprises a first terminal and a second terminal, where the first terminal is coupled to the first lead. The ferrite bead is coupled between the gate of the III-N transistor and the second terminal of the gate driver. When switching, the deleterious effects of the parasitic inductance of the circuit gate loop are mitigated by the ferrite bead.

29 Claims, 13 Drawing Sheets

Related U.S. Application Data division of application No. 14/323,777, filed on Jul. 3, 2014, now Pat. No. 9,543,940.

(51) Int. Cl.

| | | |
|---|---|---|
| *H03K 17/16* | (2006.01) | |
| *H01L 29/20* | (2006.01) | |
| *H01L 29/16* | (2006.01) | |
| *H03K 17/10* | (2006.01) | |
| *H03K 17/12* | (2006.01) | |
| *H01L 23/495* | (2006.01) | |
| *H01L 23/552* | (2006.01) | |
| *H01L 23/64* | (2006.01) | |
| *H01L 27/06* | (2006.01) | |
| *H01L 27/088* | (2006.01) | |
| *H03K 17/041* | (2006.01) | |
| *H03K 17/687* | (2006.01) | |
| *H01L 23/00* | (2006.01) | |

(52) U.S. Cl.
CPC ........ *H01L 23/645* (2013.01); *H01L 27/0605* (2013.01); *H01L 27/0883* (2013.01); *H01L 29/16* (2013.01); *H01L 29/2003* (2013.01); *H03K 17/04106* (2013.01); *H03K 17/102* (2013.01); *H03K 17/122* (2013.01); *H03K 17/16* (2013.01); *H03K 17/165* (2013.01); *H01L 24/48* (2013.01); *H01L 2224/48091* (2013.01); *H01L 2224/48106* (2013.01); *H01L 2224/48247* (2013.01); *H01L 2924/3025* (2013.01); *H03K 2017/6875* (2013.01)

(58) Field of Classification Search
USPC .... 327/108–112, 427, 434, 437; 326/82, 83, 326/87
See application file for complete search history.

(56) References Cited

U.S. PATENT DOCUMENTS

| | | | |
|---|---|---|---|
| 4,665,508 A | 5/1987 | Chang | |
| 4,717,863 A * | 1/1988 | Zeiler | H05B 41/295 315/156 |
| 4,728,826 A | 3/1988 | Einzinger et al. | |
| 4,808,853 A | 2/1989 | Taylor | |
| 4,864,479 A | 9/1989 | Steigerwald et al. | |
| 5,198,964 A | 3/1993 | Ito et al. | |
| 5,379,209 A | 1/1995 | Goff | |
| 5,493,487 A | 2/1996 | Close et al. | |
| 5,637,922 A | 6/1997 | Fillion et al. | |
| 5,767,573 A | 6/1998 | Noda et al. | |
| 5,789,951 A | 8/1998 | Shen et al. | |
| 5,952,856 A | 9/1999 | Horiguchi et al. | |
| 6,008,684 A | 12/1999 | Ker et al. | |
| 6,107,844 A | 8/2000 | Berg et al. | |
| 6,130,831 A | 10/2000 | Matsunaga | |
| 6,172,550 B1 | 1/2001 | Gold et al. | |
| 6,333,617 B1 | 12/2001 | Itabashi et al. | |
| 6,395,593 B1 | 5/2002 | Pendharkar et al. | |
| 6,455,905 B1 | 9/2002 | Perugupalli et al. | |
| 6,521,940 B1 | 2/2003 | Vu et al. | |
| 6,556,053 B2 | 4/2003 | Stanley | |
| 6,633,195 B2 | 10/2003 | Baudelot et al. | |
| 6,650,169 B2 | 11/2003 | Faye et al. | |
| 6,781,423 B1 | 8/2004 | Knoedgen | |
| 6,864,131 B2 | 3/2005 | Thornton | |
| 6,876,235 B2 | 4/2005 | Li et al. | |
| 6,900,657 B2 | 5/2005 | Bui et al. | |
| 6,975,023 B2 | 12/2005 | Oliver et al. | |
| 7,116,567 B2 | 10/2006 | Shelton et al. | |
| 7,193,396 B2 | 3/2007 | Orr | |
| 7,199,636 B2 | 4/2007 | Oswald et al. | |
| 7,199,640 B2 | 4/2007 | De Cremoux et al. | |
| 7,212,063 B2 | 5/2007 | Münzer et al. | |
| 7,227,198 B2 | 6/2007 | Pavier et al. | |
| 7,239,108 B2 | 7/2007 | Best | |
| 7,304,331 B2 | 12/2007 | Saito et al. | |
| 7,368,980 B2 | 5/2008 | Benelbar et al. | |
| 7,375,407 B2 | 5/2008 | Yanagihara et al. | |
| 7,378,883 B1 | 5/2008 | Hsueh | |
| 7,382,001 B2 | 6/2008 | Beach | |
| 7,417,257 B2 | 8/2008 | Beach et al. | |
| 7,443,648 B2 | 10/2008 | Cutter et al. | |
| 7,449,730 B2 | 11/2008 | Kuraguchi | |
| 7,453,107 B1 | 11/2008 | Kapoor | |
| 7,465,997 B2 | 12/2008 | Kinzer et al. | |
| 7,477,082 B2 | 1/2009 | Fukazawa | |
| 7,482,788 B2 | 1/2009 | Yang | |
| 7,501,669 B2 | 3/2009 | Parikh et al. | |
| 7,522,435 B2 | 4/2009 | Kohnotoh et al. | |
| 7,538,366 B2 | 5/2009 | Saito et al. | |
| 7,547,964 B2 | 6/2009 | Pavier et al. | |
| 7,548,112 B2 | 6/2009 | Sheppard | |
| 7,550,781 B2 | 6/2009 | Kinzer et al. | |
| 7,612,602 B2 | 11/2009 | Yang et al. | |
| 7,639,064 B2 | 12/2009 | Hsiao et al. | |
| 7,701,009 B2 | 4/2010 | Koyama | |
| 7,714,360 B2 | 5/2010 | Otsuka et al. | |
| 7,719,055 B1 | 5/2010 | McNutt et al. | |
| 7,745,930 B2 | 6/2010 | Connah et al. | |
| 7,746,020 B2 | 6/2010 | Schnetzka et al. | |
| 7,755,108 B2 | 7/2010 | Kuraguchi | |
| 7,782,099 B2 | 8/2010 | Kawamura | |
| 7,800,215 B2 | 9/2010 | Satou et al. | |
| 7,804,328 B2 | 9/2010 | Pentakota et al. | |
| 7,811,872 B2 | 10/2010 | Hoshi et al. | |
| 7,851,825 B2 | 12/2010 | Suh et al. | |
| 7,851,909 B2 | 12/2010 | Mishra et al. | |
| 7,852,137 B2 | 12/2010 | Machida et al. | |
| 7,855,401 B2 | 12/2010 | Sheppard et al. | |
| 7,863,877 B2 | 1/2011 | Briere | |
| 7,875,907 B2 | 1/2011 | Honea et al. | |
| 7,875,914 B2 | 1/2011 | Sheppard | |
| 7,884,395 B2 | 2/2011 | Saito | |
| 7,893,676 B2 | 2/2011 | Hanna | |
| 7,893,791 B2 | 2/2011 | Ma et al. | |
| 7,898,004 B2 | 3/2011 | Wu et al. | |
| 7,898,509 B2 | 3/2011 | Iida et al. | |
| 7,902,809 B2 | 3/2011 | Briere et al. | |
| 7,906,837 B2 | 3/2011 | Cabahug et al. | |
| 7,915,643 B2 | 3/2011 | Suh et al. | |
| 7,920,013 B2 | 4/2011 | Sachdev et al. | |
| 7,932,539 B2 | 4/2011 | Chen et al. | |
| 7,965,126 B2 | 6/2011 | Honea et al. | |
| 7,973,335 B2 | 7/2011 | Okamoto et al. | |
| 7,982,242 B2 | 7/2011 | Goto | |
| 8,013,580 B2 | 9/2011 | Cervera et al. | |
| 8,018,056 B2 | 9/2011 | Hauenstein | |
| 8,054,110 B2 | 11/2011 | Wang et al. | |
| 8,063,616 B2 | 11/2011 | Bahramian et al. | |
| 8,084,783 B2 | 12/2011 | Zhang | |
| 8,089,139 B2 | 1/2012 | Shi et al. | |
| 8,114,710 B2 | 2/2012 | Muto et al. | |
| 8,188,596 B2 | 5/2012 | Otremba | |
| 8,193,559 B2 | 6/2012 | Haeberlen et al. | |
| 8,193,562 B2 | 6/2012 | Suh et al. | |
| 8,258,622 B2 | 9/2012 | Lee et al. | |
| 8,289,065 B2 | 10/2012 | Honea et al. | |
| 8,363,437 B2 | 1/2013 | Wang et al. | |
| 8,441,128 B2 | 5/2013 | Domes | |
| 8,530,904 B2 | 9/2013 | Treu et al. | |
| 8,681,518 B2 | 3/2014 | Callanan et al. | |
| 8,742,460 B2 | 6/2014 | Mishra et al. | |
| 9,543,940 B2 | 1/2017 | Wang et al. | |
| 9,660,640 B2 * | 5/2017 | Wang | H03K 17/16 |
| 2002/0067139 A1 | 6/2002 | Sabate | |
| 2002/0190389 A1 * | 12/2002 | Koenck | H01L 23/3733 257/773 |
| 2004/0047540 A1 * | 3/2004 | Moto | H01L 23/66 385/14 |
| 2004/0120090 A1 | 6/2004 | Galli et al. | |
| 2004/0240236 A1 | 12/2004 | Lanni | |

(56) References Cited

U.S. PATENT DOCUMENTS

| | | | |
|---|---|---|---|
| 2006/0226433 A1* | 10/2006 | Kawano | H01L 23/49562 257/81 |
| 2007/0109707 A1 | 5/2007 | Honda | |
| 2007/0210329 A1 | 9/2007 | Goto | |
| 2008/0017998 A1 | 1/2008 | Pavio | |
| 2008/0061876 A1* | 3/2008 | Kaya | H03F 3/217 330/207 P |
| 2008/0248634 A1 | 10/2008 | Beach | |
| 2009/0050936 A1 | 2/2009 | Oka | |
| 2009/0072269 A1 | 3/2009 | Suh et al. | |
| 2009/0278513 A1 | 11/2009 | Bahramian et al. | |
| 2011/0169549 A1 | 7/2011 | Wu | |
| 2012/0001662 A1* | 1/2012 | Pidutti | H02M 1/32 327/108 |
| 2012/0132973 A1* | 5/2012 | Wu | H01L 23/057 257/296 |
| 2012/0306464 A1 | 12/2012 | Hirler et al. | |
| 2016/0006428 A1 | 1/2016 | Wang et al. | |

FOREIGN PATENT DOCUMENTS

| | | |
|---|---|---|
| CN | 102165694 | 8/2011 |
| CN | 102308387 | 1/2012 |
| CN | 103477543 | 12/2013 |
| EP | 2 188 842 | 5/2010 |
| EP | 2 243 213 | 10/2010 |
| EP | 2 394 303 | 12/2011 |
| JP | 5-075040 | 3/1993 |
| JP | 6-067744 | 3/1994 |
| JP | 2000-101356 | 4/2000 |
| JP | 2000-124358 | 4/2000 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2007-036218 | 2/2007 |
| JP | 2007-215331 | 8/2007 |
| JP | 2007-294769 | 11/2007 |
| JP | 2008-199771 | 8/2008 |
| JP | 2010-525023 | 7/2010 |
| JP | 2011-512119 | 4/2011 |
| JP | 2012-517699 | 8/2012 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| TW | 201332085 | 8/2013 |
| TW | 201347143 | 11/2013 |
| WO | WO 2009/036266 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |
| WO | WO 2013/085839 | 6/2013 |

OTHER PUBLICATIONS

Authorized officer Simin Baharlou, International Preliminary Report on Patentability in PCT/US2008/076160, dated Mar. 25 2010, 6 pages.
Authorized officer Jae Woo Wee, International Search Report and Written Opinion in PCT/US2009/033699, dated Sep. 21, 2009, 11 pages.
Authorized officer Dorothée Mülhausen, International Preliminary Report on Patentability in PCT/US2009/033699, dated Aug. 26, 2010, 6 pages.
Authorized officer Sung Hee Kim, International Search Report and the Written Opinion in PCT/US2009/057554, dated May 10, 2010, 13 pages.
Authorized Officer Gijsbertus Beijer, International Preliminary Report on Patentability in PCT/US2009/057554, dated Mar. 29, 2011, 7 pages.
Authorized officer Sung Chan Chung, International Search Report and Written Opinion for PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 6 pages.
Authorized officer Bon Gyoung Goo, International Search Report and Written Opinion in PCT/US2010/055129, dated Jul. 1, 2011, 11 pages.
Authorized officer Yolaine Cussac, International Preliminary Report on Patentability in PCT/US2010/055129, dated May 18, 2012, 6 pages.
Authorized officer Sung Joon Lee, International Search Report and Written Opinion in PCT/US2011/020592, dated Sep. 19, 2011, 9 pages.
Authorized officer Philippe Bécamel, International Preliminary Report on Patentability in PCT/US2011/020592, dated Jul. 19, 2012, 7 pages.
Authorized officer Kee Young Park, International Search Report and Written Opinion in PCT/US2011/023485, dated Sep. 23 2011, 10 pages.
Authorized officer Nora Lindner, International Preliminary Report on Patentability in PCT/US2011/023485, dated Aug. 16, 2012, 7 pages.
Authorized officer Kwak In Gu, International Search Report and Written Opinion in PCT/US2012/026810, dated Jan. 23, 2013, 10 pages.
Authorized officer Lingfei Bai, International Preliminary Report on Patentability in PCT/US2012/026810, dated Sep. 12, 2013, 6 pages.
Authorized officer Sung Gon Kim, International Search Report and Written Opinion in PCT/US2014/032241, dated Aug. 11, 2014, 12 pages.
Authorized officer Athina Nickitas-Etienne, International Preliminary Report on Patentabililty in PCT/US2014/032241, dated Oct. 15, 2015, 9 pages.
Authorized officer Sang Won Choi, International Search Report and Written Opinion in PCT/US2015/039041, dated Oct. 14, 2015, 16 pages.
Search Report and Action in TW Application No. 098132132, dated Dec. 6, 2012, 8 pages.
Search Report and Action in TW Application No. 098141930, dated Jul. 10, 2014, 7 pages.
Chinese Third Office Action in Application No. 200980110230.0, dated Jan. 24, 2014, 18 pages.
Japanese Office action in Application No. 2010-546867, dated Sep. 24, 2013, 14 pages.
Chen et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Choi et al., "AN-9005 Driving and Layout Design for Fast Switching Super-junction MOSFETs," © 2013 Fairchild Corporation, 13 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Rodriguez et al, "Tutorial on Multilevel Converters," International Conference on Power Electronics and Intelligent Control for Energy Conservation, Warsaw, Poland, Oct. 17-19, 2005, 148 pages.
Wu et al., "A 97.8% Efficient GaN HEMT Boost Converter with 300-W Output Power at 1MHz," Electronic Device Letters, 2008, IEEE, 29(8):824-826.

\* cited by examiner

SWITCHING CIRCUITS HAVING FERRITE BEADS

CROSS-REFERENCE TO RELATED APPLICATIONS

This application is a continuation of U.S. application Ser. No. 15/363,987, filed on Nov. 29, 2016, which is a divisional of U.S. application Ser. No. 14/323,777, filed on Jul. 3, 2014 (now U.S. Pat. No. 9,543,940). The disclosures of the prior applications are considered part of and are incorporated by reference in the disclosure of this application.

TECHNICAL FIELD

This specification relates to stabilizing switching circuits, e.g., high speed III-N power switches, using ferrite beads.

BACKGROUND

Using high-speed III-N power switches involves balancing requirements for heat transfer, ease of assembly, and high-speed, low-inductance electrical interconnection. Conventional leaded power packages, such as any of the variations of the TO-220 package, can be used with III-N power switches. The combination of a metal mounting tab and flexible copper leads permits attachment of the package to effective heat sinks in a variety of configurations. Connection to a PCB with conventional soldering techniques permits ease of manufacture.

Nonetheless, the package leads typically introduce undesirable inductance. Reduction in switching speed caused by this inductance may be an acceptable design compromise, but instability may still present a problem. Since a power switch can be a high-gain device, if allowed to operate in a linear mode, care should be taken that any oscillations due to parasitic resonances do not couple to a node where positive feedback may sustain or amplify the oscillations.

FIG. 1 is a circuit diagram of a half bridge circuit comprising a gate driver 102, a high side III-N transistor 104 coupled to a high voltage node 106, and a low side III-N transistor 108 coupled to a ground node 110. Two terminals of the gate driver 102 are coupled to respective gates of the transistors 104 and 108, and two terminals of the gate driver are coupled to respective sources of the transistors 104 and 108, such that the gate driver is able to apply voltage signals to the gates of each of transistors 104 and 108 relative to their respective sources. An inductive load 114 is coupled to the half bridge circuit at a load node 112.

In operation, the gate driver 102 can operate the transistors 104 and 108 in a constant-current mode (CCM), switching rated current at rated voltage. For example, the high voltage node can provide a voltage of 400V or 600V or greater, and the III-N transistors can be configured with a rating to withstand the resulting high currents. Due to the inductance of the load 114, current flowing through the load 114 cannot change instantaneously.

To illustrate the operation of the half bridge, consider an example scenario where the gate driver 102 turns the high side transistor 104 on and turns the low side transistor 108 off. Current flows from the high voltage node 106, through the high side transistor 104, and through the load node 112 to the load 114. When the gate driver 102 turns the high side transistor 104 off, the inductance of the load 114 drives the voltage at the load node 112 negative, which allows current to flow up through the low side transistor 108 even though it is off. If the half bridge is implemented using a conventional package, the undesirable inductance introduced by the package leads can cause significant ringing and oscillation related to transient current flowing through the circuit, which can interfere with a stable, efficient switching function.

SUMMARY

In a first aspect, a circuit comprises an electronic component package with at least a first lead, where the electronic component package contains a III-N device with a drain, gate, and source, with the source coupled to the first lead. The circuit further comprises a gate driver with a first and second terminal, where the first terminal is coupled to the first lead, and a ferrite bead coupled between the gate of the III-N transistor and the second terminal of the gate driver.

In a second aspect, a circuit comprises a gate driver with a first and second high side output terminals and a first and second low side output terminals. The circuit further includes a high side III-N device with a high side gate coupled to the first high side output terminal of the gate driver, a high side drain coupled to a high voltage node, and a high side source coupled to a load node. The circuit also includes a low side III-N device with a low side gate coupled to the first low side output terminal of the gate driver, a low side drain coupled to the load node, and a low side source coupled to a ground node. A ferrite bead is coupled between the high side gate and the first high side output terminal of the gate driver.

In a third aspect, an electronic component comprises an electronic package with at least a first lead, a III-N switching device with a gate, wherein the III-N switching device is encased in the electronic package, and a ferrite bead encased in the electronic package, wherein the ferrite bead is coupled between the gate and the first lead.

In a fourth aspect, a circuit comprises a gate driver with high side and low side output terminals, a first electronic component, and a second electronic component. The first electronic component comprises a first electronic package, which includes a first conductive structural base, and a high side III-N device encased in the first electronic package, which includes a high side gate coupled to the high side output terminal of the gate driver by a ferrite bead encased in first electronic package, a high side source coupled to a load node, and a high side drain coupled to a high voltage node by the first conductive structural base of the first electronic package. The second electronic component comprises a second electronic package, which includes a second conductive structural base, and a low side III-N device encased in the second electronic package, which includes a low side gate coupled to the low side output terminal of the gate driver, a low side drain coupled to the load node, and a low side source coupled to a ground node by the second conductive structural base of the second electronic package.

The circuits and components described herein may each include one or more of the following. The circuit can include a gate loop formed with the second terminal of the gate driver, the ferrite bead, the III-N device, the first lead, and the first terminal, where the first lead has a parasitic inductance and the ferrite bead is configured to reduce oscillations and electromagnetic interference in the gate loop due to the parasitic inductance. The circuit can include a low side switch formed with the III-N device and the electronic component package, where the first lead is coupled to a ground node. The circuit can further include a high side switch coupled between the drain of the III-N device and a high voltage node, where the high side switch comprises a high side gate coupled to a third terminal of the gate driver. The gate driver can be configured to apply a low side control signal to the second terminal relative to the first terminal and a high side control signal to the third terminal relative to a fourth terminal of the gate driver, where the fourth terminal is coupled to a high side source of the high side switch.

The circuit can further include a processor, which is coupled to the gate driver, and memory storing executable instructions that, when executed by the processor, cause the processor to control the gate driver to operate the circuit as a half bridge. In the circuit, the voltage at the high voltage node relative to the ground node can be about 400V or higher. The gate driver can be configured to apply a control signal to the second terminal relative to the first terminal, where the control signal has a frequency between 30 kHz and 10 MHz. The circuit can be constructed such that a second ferrite bead is coupled between the high side gate and the third terminal of the gate driver. The III-N device can be an enhancement mode transistor or a hybrid device that includes a depletion mode III-N transistor and an enhancement mode silicon transistor. In the circuit, the ferrite bead can be configured to block electromagnetic interference having frequencies above 100 MHz. The circuit can be constructed such that the electronic component package further includes a second lead, where the second lead is coupled to the source and to a ground node, and the first lead is electrically connected to the first terminal of the gate driver.

During operation of the circuit, the voltage at the high node relative to the ground node can be at least 400V. The gate driver can be configured to apply control signals with a frequency between 30 kHz and 10 MHz to the first high side output terminal relative to the second high side output terminal and to the first low side output terminal relative to the second output terminal.

The III-N switching device in the electronic component can be an enhancement mode III-N transistor or a hybrid device that includes a depletion mode III-N transistor and an enhancement mode transistor, where the gate is a first gate of the enhancement mode transistor. The electronic package can include a conductive structural base, wherein the depletion mode III-N transistor is a lateral III-N transistor including a second gate, and the second gate is electrically connected to the conductive structural base of the electronic package. The electronic package can further include a conductive structural base, which the III-N switching device and the ferrite bead are both mounted on.

The electronic component can include a first wire bond between the ferrite bead and the gate and a second wire bond between the ferrite bead and the first lead. The III-N switching device can include a III-N transistor that has a source and drain coupled to second and third leads of the electronic package, wherein the electronic package includes a fourth lead coupled to the source for directly coupling of the source to a gate driver. The electronic package can include a conductive structural base, wherein the enhancement mode III-N transistor is a lateral III-N transistor, the gate is a gate of the enhancement mode III-N transistor, and a source or drain of the enhancement mode III-N transistor is electrically connected to the conductive structural base of the electronic package.

The gate driver can be configured to output respective control signals to the high side and low side terminals, where the control terminals have a frequency between 50 kHz and 1 MHz. The high side III-N device can be an enhancement mode transistor or a hybrid device that comprises a depletion mode III-N transistor and an enhancement mode transistor.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \le w \le 1$, $0 \le x \le 1$, $0 \le y \le 1$, and $0 \le z \le 1$. III-N materials, layers, or devices, can be formed or prepared by either directly growing on a suitable substrate (e.g., by metal organic chemical vapor deposition), or growing on a suitable substrate, detaching from the originally substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications.

As used herein, a "high-voltage device", e.g., a high-voltage switching transistor, is an electronic device which is optimized for high-voltage switching applications. That is, when the transistor is off, it is capable of blocking high voltages, such as about 300V or higher, about 600V or higher, or about 1200V or higher, and when the transistor is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, or other suitable blocking voltage required by the application.

As used herein, a "III-Nitride" or "III-N device" is a device based on III-N materials. The III-N device can be designed to operate as an enhancement-mode (E-mode) transistor device, such that the threshold voltage of the device (i.e., the minimum voltage that must be applied to the gate relative to the source in order to turn the device on) is positive. Alternatively, the III-N device can be a depletion-mode (D-mode) device, having a negative threshold voltage. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, or higher. When the high voltage device is biased on (e.g., the voltage on the gate relative to the source is greater than the device threshold voltage), it is able to conduct substantial current with a low on-voltage. The maximum allowable on-voltage is the maximum voltage that can be sustained in the application in which the device is used.

The details of one or more disclosed implementations of the subject matter described in this specification are set forth in the accompanying drawings and the description below. Other features, aspects, and advantages will become apparent from the description, the drawings and the claims.

DESCRIPTION OF DRAWINGS

Like reference symbols in the various drawings indicate like elements.

DETAILED DESCRIPTION

Figure 1:
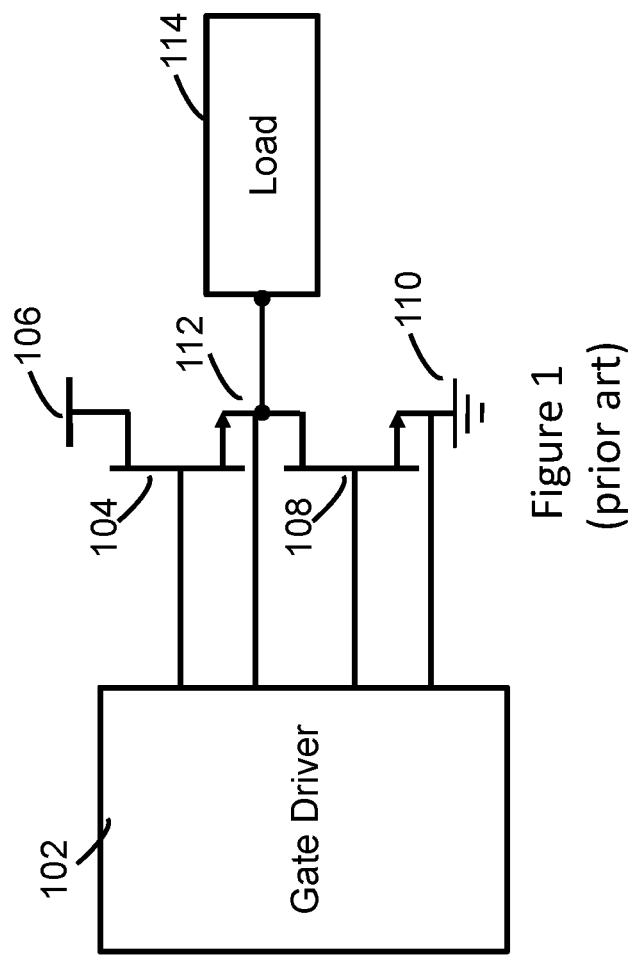
FIG. 1 is a circuit diagram of a half bridge circuit comprising a gate driver, a high side III-N transistor coupled to a high voltage node, and a low side III-N transistor coupled to a ground node.
Figure 2:
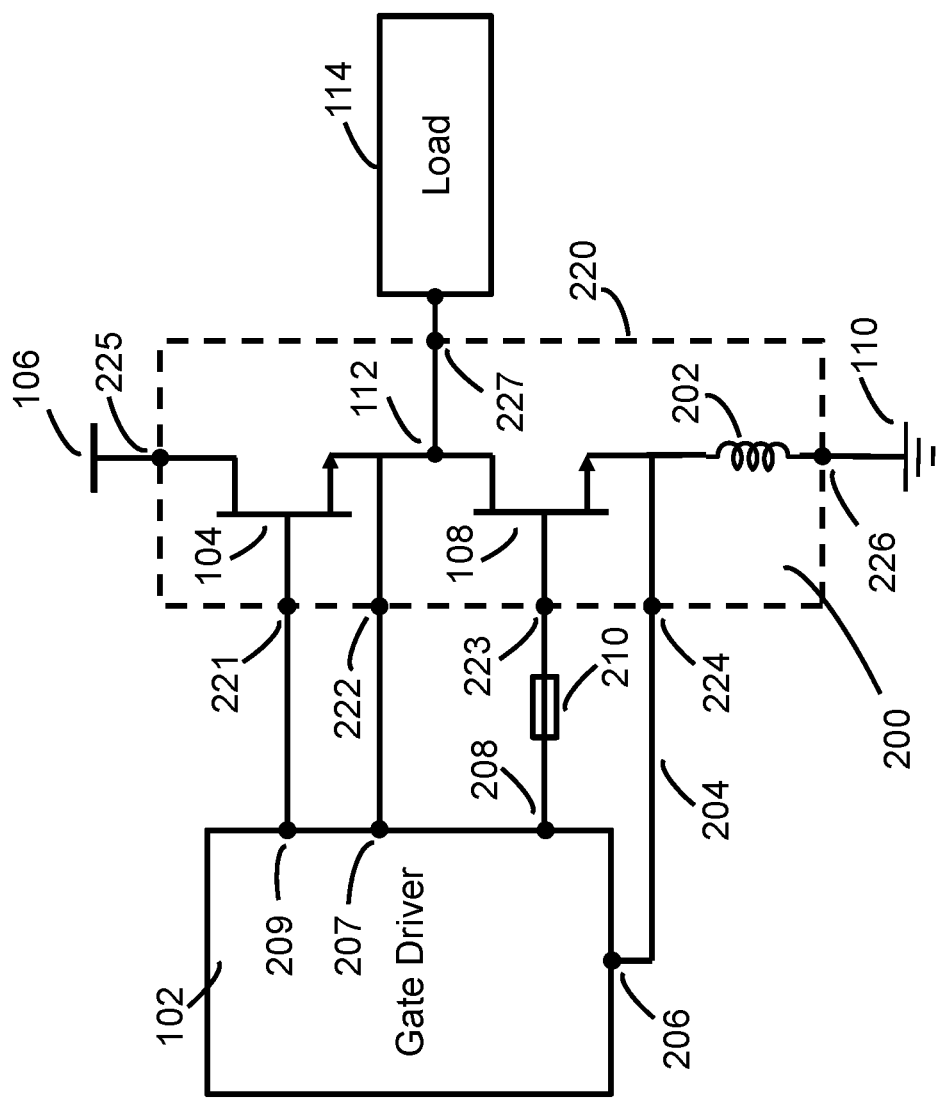
FIG. 2 is a circuit diagram of an example switching circuit in which a portion of the circuit is implemented as an electronic module.

FIG. 2 is a circuit diagram of an example switching circuit in which a portion of the circuit is implemented as an electronic module 200. The module 200 includes a high side switch 104 connected in series with a low side switch 108 in a half bridge configuration. The module casing, indicated by dashed line 220, includes nodes 221-227. Nodes 221 and 222 are coupled (e.g., electrically connected) to the gate and source, respectively, of switch 104. Nodes 223 and 224 are coupled (e.g., electrically connected) to the gate and source, respectively, of switch 108. Node 225 is coupled (e.g., electrically connected) to the drain of switch 104. Node 226 is coupled (e.g., electrically connected) to the source of switch 108 by a connection that has a parasitic inductance 202. Output node 227 is coupled (e.g., electrically connected) to load node 112 at the output of the half bridge formed by switches 104 and 108. The circuit further includes a gate driver 102 which is connected to nodes 221-224 of the module in order to apply voltage signals to the gates of switches 104 and 108 relative to their respective sources. An inductive load 114 is coupled (e.g., electrically connected) to the module at output node 227. The electronic module can be formed as a circuit board with printed wiring connections that electrically couple the components of the module.

Figure 3:
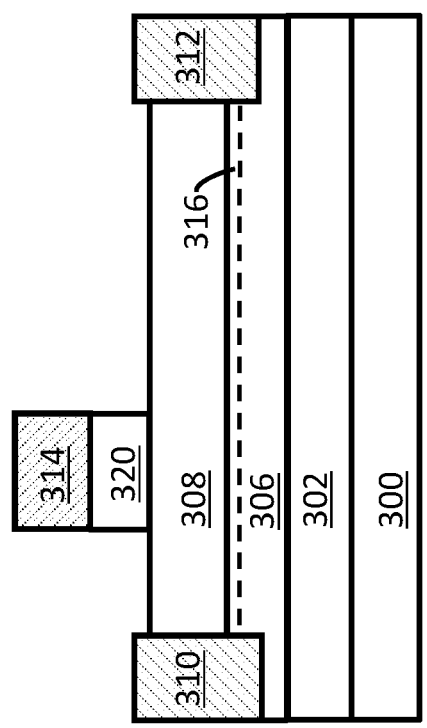
FIG. 3 is an illustration of a III-N transistor as an example of the switches in FIG. 2.

Switches 104 and 108 are capable of being operated at higher switching frequencies than some switches used in conventional high-voltage power switching circuits, such as switches implemented as silicon-based transistors (e.g., silicon-based MOSFETs or IGBTs). For example, switches 104 and 108 can be III-N transistors, such as the III-N transistor shown in FIG. 3, which may be capable of being switched at higher frequencies than silicon-based MOSFETs or IGBTs without exhibiting substantial additional power loss or other instabilities during operation. As seen in FIG. 3, a III-Nitride high electron mobility transistor (HEMT) can include a substrate 300 (e.g., a silicon substrate), a III-N buffer layer 302 formed of a III-N semiconductor material such as AlN or AlGaN, a III-N channel layer 306 formed of a III-N semiconductor material such as GaN, a III-N barrier layer 308 formed of a III-N semiconductor material (e.g., AlGaN or AlN) having a larger bandgap than that of the III-N channel layer 306, and a two-dimensional electron gas (2DEG) channel 316 formed in the III-N channel layer 306 adjacent to the III-N barrier layer 308, the 2DEG channel 316 serving as the conductive channel of the transistor. The III-N HEMT further includes source and drain contacts 310 and 312, respectively, which contact the 2DEG channel 316. A gate electrode 314, which is deposited between the source and drain contacts 310 and 312, is used to modulate the conductivity of the channel in the region directly below the gate electrode 314. Optionally, a gate insulator 320 is included between the gate electrode 314 and the underlying III-N semiconductor materials.

In many applications, it is preferable that switches 104 and 108 be enhancement-mode devices. However, switching devices formed of single high-voltage enhancement-mode transistors can be difficult to fabricate reliably. For example, due at least partially to tight process tolerances, it can be difficult to design a III-N HEMT such as the device shown in FIG. 3 such that it consistently and reliably operates as an enhancement-mode device with a positive threshold voltage. That is, even when a design is implemented for a III-N HEMT for which the resulting HEMT should be an enhancement-mode device, small variations in layer thicknesses, feature dimensions, etc., that typically occur can result in many of the devices either being depletion-mode devices or otherwise not exhibiting a high enough threshold voltage for reliable operation.

Figure 4:
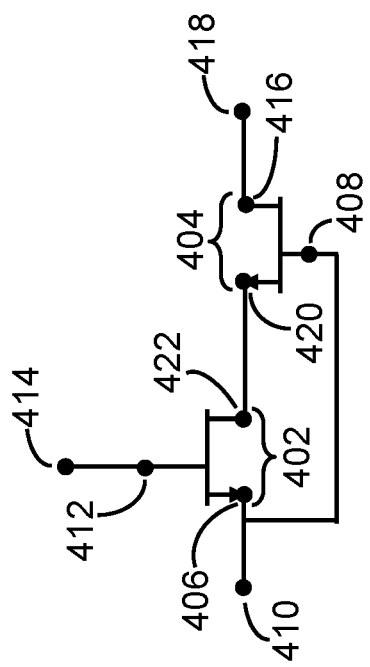
FIG. 4 is a circuit schematic illustrating a hybrid device that includes a high-voltage D-mode transistor and a low-voltage E-mode transistor.

As an alternative to a single high-voltage enhancement-mode transistor, when enhancement-mode switches which can be operated at high switching frequencies are desired for switches 104 and 108, the switches can each be implemented as a hybrid device that includes a high-voltage depletion-mode (D-mode) transistor 404 and a low-voltage enhancement-mode (E-mode) transistor 402, configured as shown in FIG. 4. The resulting hybrid device of FIG. 4 can be operated in the same way as a single high-voltage E-mode transistor, and in many cases achieves the same or similar output characteristics as a single high-voltage E-mode transistor. The source electrode 406 of the low-voltage E-mode transistor 402 and the gate electrode 408 of the high-voltage D-mode transistor 404 are both electrically connected together, for example with wire bonds, and together form the source 410 of the hybrid device. The gate electrode 412 of the low-voltage E-mode transistor 402 forms the gate 414 of the hybrid device. The drain electrode 416 of the high-voltage D-mode transistor 404 forms the drain 418 of the hybrid device. The source electrode 420 of the high-voltage D-mode transistor 404 is electrically connected to the drain electrode 422 of the low-voltage E-mode transistor 402.

In particular implementations of the hybrid device of FIG. 4, the hybrid device is implemented as a III-N device. In this case, the D-mode transistor 404 is a high-voltage III-N D-mode transistor (e.g., capable of blocking at least 200V while biased in the OFF state), and the E-mode transistor 402 is a low-voltage silicon-based E-mode transistor (e.g., cannot reliably block voltages greater than 100V while biased in the OFF state). Although such an implementation of a III-N switch utilizes a silicon-based transistor in the switch, because the silicon-based transistor is a low-voltage device, the switch can still be capable of being operated at the higher switching frequencies.

Referring back to FIG. 2, due to the use of III-N transistors (as in FIG. 3) or hybrid devices (as in FIG. 4), e.g., III-N hybrid devices, as switches 104 and 108, the switching circuit illustrated in FIG. 2 can be operated at higher switching frequencies than some conventional switching circuits implemented using silicon transistors. For example, the switching circuits can be operated at a switching frequency of 30 kHz or higher, 50 kHz or higher, 80 kHz or higher, or up to 1 MHz or higher (i.e., during operation of the circuit, the switches can be switches at a frequency of 30 kHz or higher, 50 kHz or higher, 80 kHz or higher, or up to 1 MHz or higher).

When a switching circuit is designed to operate at a given switching frequency, unwanted noise and oscillations will occur at an even higher frequency. For example, if the switching frequency is about 1 MHz or less, the oscillations can be between about 100 MHz and 300 MHz. Unwanted oscillations are especially prone to occur in circuits operated at higher switching frequencies, even if the individual switches are capable of operation at the higher switching frequencies.

Referring again to FIG. 2, a ferrite bead 210 is coupled between the gate of the low side switch 108 and the second terminal 208 of the gate driver 102. A ferrite bead is a passive electric component and typically is a hollow bead or cylinder made of ferrite, a semi-magnetic substance made from iron oxide alloyed with other metals. A ferrite bead can be used to suppress noise from electromagnetic interference (EMI) in a circuit.

In the example switching circuit of FIG. 2, in which the half bridge formed by the high side and low side switches 104 and 108 and configured to be operated at the higher frequencies is implemented as part of an electronic module 200, the ferrite bead 210 generally will not be effective in reducing noise. The current from the source of the low side switch 108 flows through the parasitic inductance and therefore does not flow through the connection 204 to the first terminal 206 of the gate driver 102. Since there is essentially no current flowing through the connection 204, the noise from the parasitic inductance 202 is decoupled from the loop formed by the gate driver 102, the low side switch 108, and the connectors between the gate driver 102 and the source and gate of the low side switch 108. The ineffectiveness of the ferrite bead 210 in this configuration suggests that the ferrite bead 210 would also not be effective in other configurations.

Figure 5:
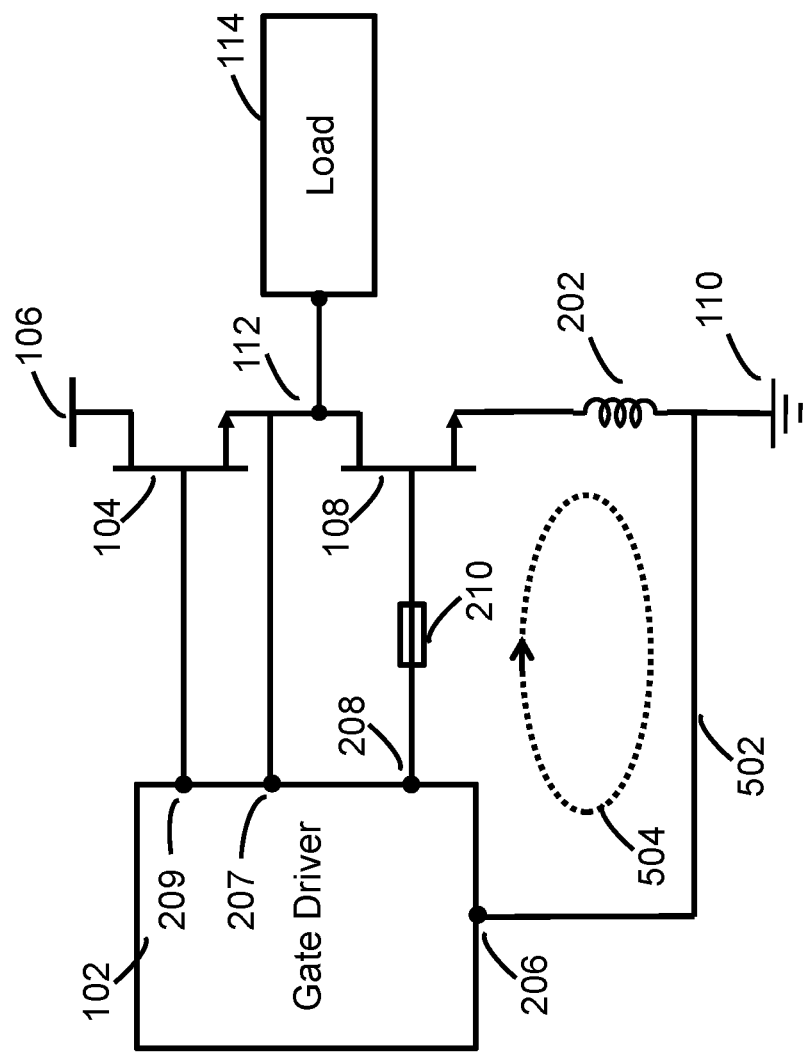
FIG. 5 is a circuit diagram of the example switching circuit where the switches are each encased in individual electronic packages.
Figure 6:
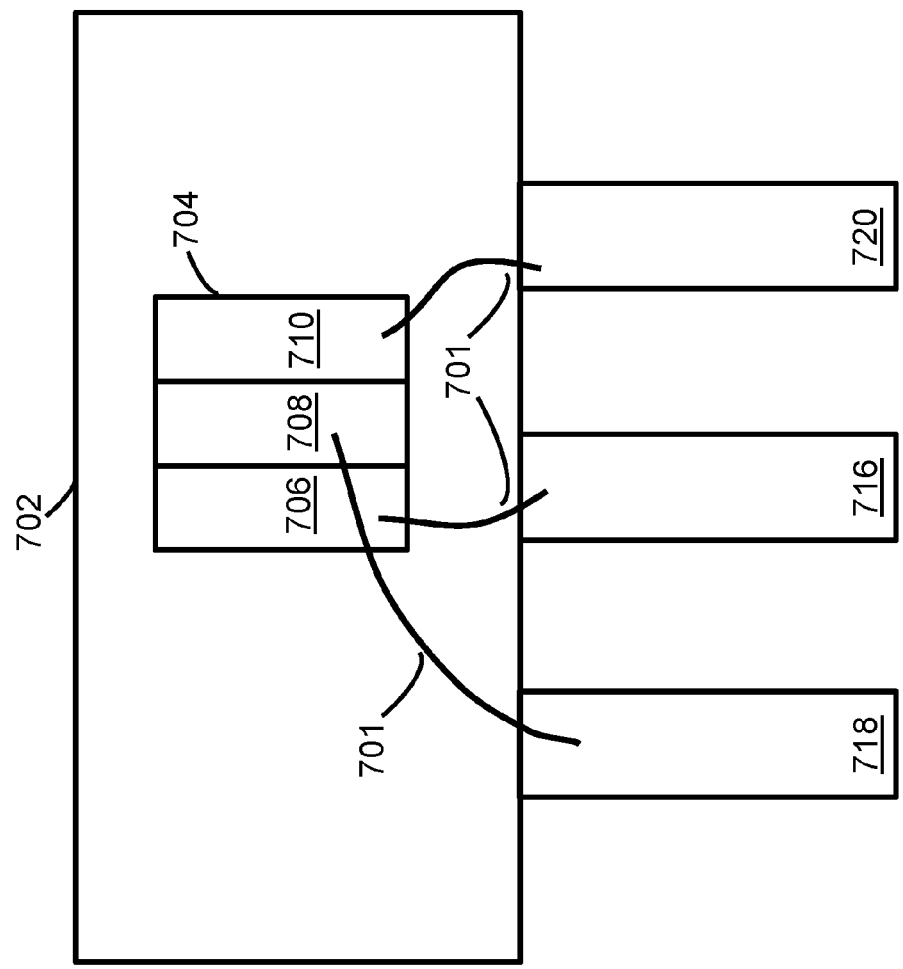
FIG. 6 is a schematic illustration of a packaged III-N device as an example of the packaged switches in FIG. 5.

FIG. 5 is a circuit diagram of the example switching circuit where the switches 104 and 108 are each encased in individual electronic packages. An example of such a packaged III-N device is illustrated in FIG. 6. The package 702 can, for example, include a metal mounting tab (not shown) which is connected to either a source 706 or a drain 710 of the III-N device 704, as well as source, gate, and drain leads 716, 718, and 720, respectively, connected to the respective source, gate, and drain of the III-N device by connections 701 (e.g., wire bonds). When the packaged III-N device of FIG. 6 is used for switch 108 in FIG. 5, the source lead 716 of the package is connected both to the first terminal 206 of the gate driver (via connection 502) and to ground 110, the gate lead 718 is connected to the ferrite bead 210, and the drain lead 720 is connected to the source lead of the package of switch 104. As seen in FIG. 5, in this configuration, the point at which connection 502 is connected to the switch 108 is between the ground 110 and the parasitic source inductance 202 of the switch 108. Consequently, in this configuration the parasitic inductance 202 between the source of the low side switch 108 and the ground node 110 is seen by the gate driver 102.

In this configuration, the first terminal 206 of the gate driver 102, the second terminal 208 of the gate driver 102, the ferrite bead 210, the low side switch 108, and the parasitic inductance 202 form a gate loop 504. The gate loop 504 is shown for purposes of illustration and does not indicate a physical structure. Here, the ferrite bead 210 can be effective in reducing oscillation and associated EMI or instability in the gate loop 504 due to the parasitic inductance 202. The effectiveness of the ferrite bead 210 in this configuration is unexpected in view of the ineffectiveness of the ferrite bead 210 observed in the electronic circuit for which the half bridge was implemented as part of a module 200, as illustrated in FIG. 2.

Figure 7:
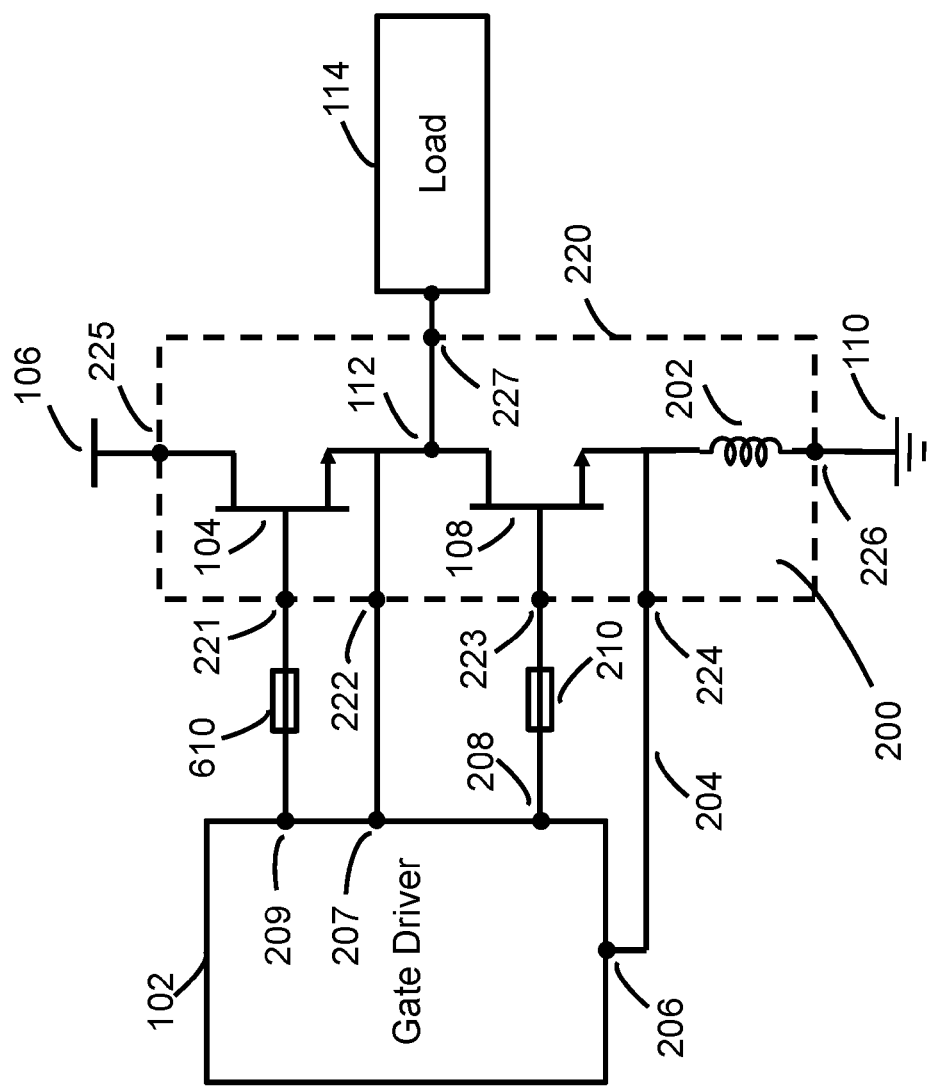
FIG. 7 is a circuit diagram of the example switching circuit in which a portion of the circuit is implemented as an electronic module, with a second ferrite bead coupled between a third terminal of the gate driver and the gate of the high side switch.

FIG. 7 is a circuit diagram of the example switching circuit, where a portion of the circuit is again implemented as an electronic module 200, as in FIG. 2. In the configuration of FIG. 7, in addition to the ferrite bead 210 coupled between the gate of the low side switch 108 and the second terminal 208 of the gate driver 102, a second ferrite bead 610 is coupled between a third terminal 209 of the gate driver 102 and the gate of the high side switch 104. Here, the second ferrite bead 610 can be effective in reducing oscillations at the gate of the high side switch 104, which is unexpected in view of the ineffectiveness of the ferrite bead 210 coupled to the gate of the low side switch 108.

Although not shown in FIG. 5, similar to FIG. 7, a second ferrite bead 610 may also be coupled between the third terminal 209 of the gate driver 102 and the gate lead of the package of the high side switch 104 in the configuration of FIG. 5. This configuration is shown in FIG. 8.

The ferrite beads 210 and 610 in the circuits of FIGS. 2, 5, 7, and 8 can be selected to form a passive low pass filter configured to block oscillations having frequencies above about 100 MHz or 300MHz and to pass switching frequencies, e.g., in the tens or hundreds of kHz or the 1 MHz range. Various ferrite beads are available and an appropriate ferrite bead can be selected for a switching circuit based on a target switching frequency.

Figure 8:
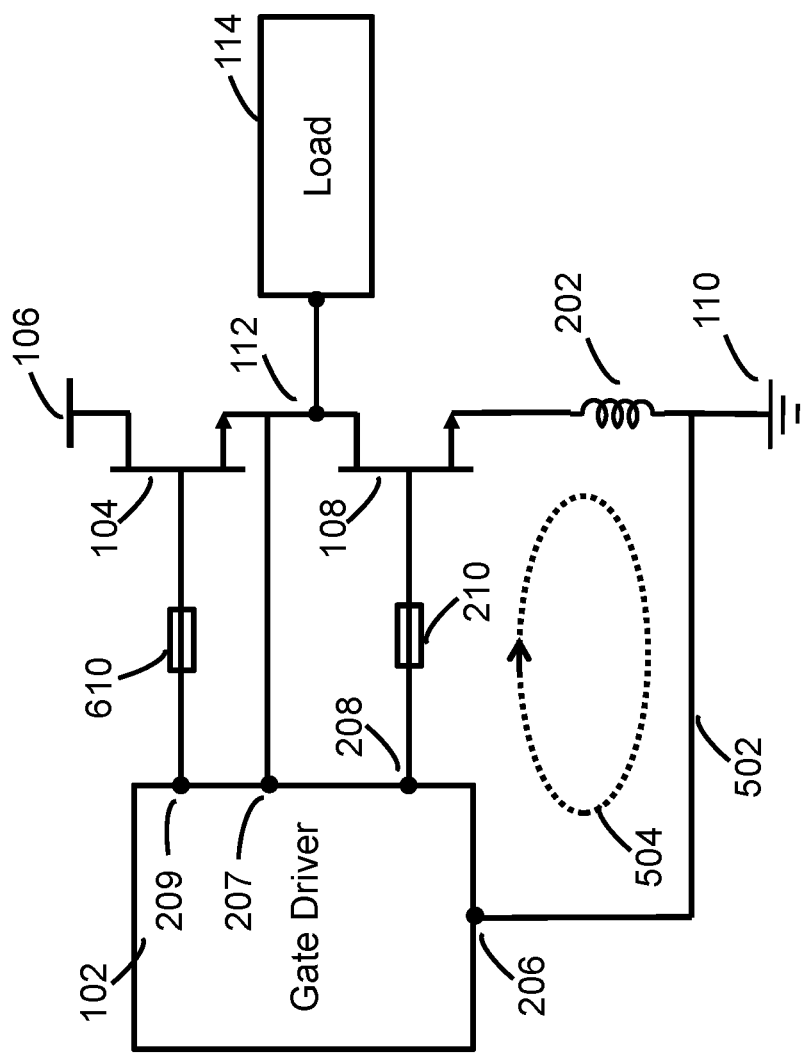
FIG. 8 is a circuit diagram of the example switching circuit where the switches are each encased in individual electronic packages, with a second ferrite bead coupled between a third terminal of the gate driver and the gate of the high side transistor.
Figure 9:
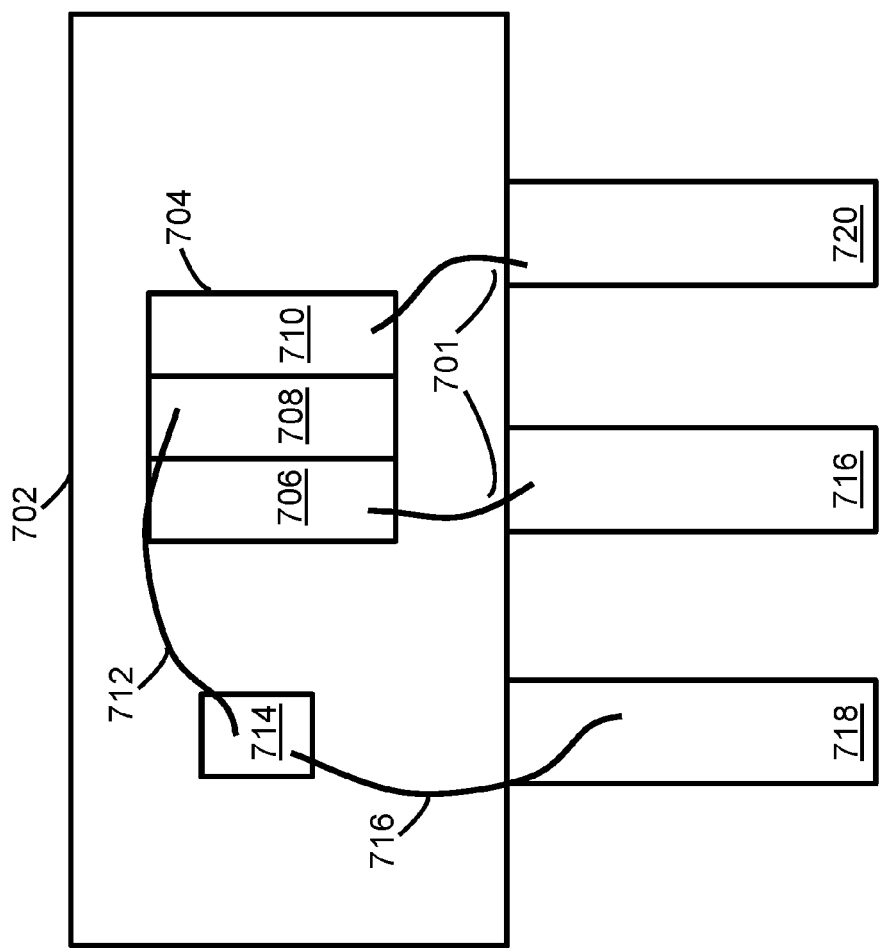
FIG. 9 is a schematic illustration of a switch which includes a III-N transistor encased in an electronic package.

For the configurations of FIGS. 5 and 8, in which individually packaged transistor switches are used for switches 104 and 108, the ferrite beads 210 and 610 may alternatively be incorporated within the packages of their respective switches. FIG. 9 is a schematic illustration of a switch which includes a III-N transistor 704 encased in an electronic package 702. The transistor 704 includes a source 706, a gate 708, and a drain 710. A first connector 712, which can for example be a wire bond, electrically couples the gate 708 to a ferrite bead 714 which is also encased in and mounted directly to the package 702. A second connector 716, which can for example also be a wire bond, electrically couples the ferrite bead 714 to a package lead 718 for the gate 708. By encasing the ferrite bead directly within the package 702, an external ferrite bead is not needed to use the switch in switching circuits which utilize individually packaged switches, e.g., the switching circuits illustrated in FIGS. 5 and 8.

Figure 10:
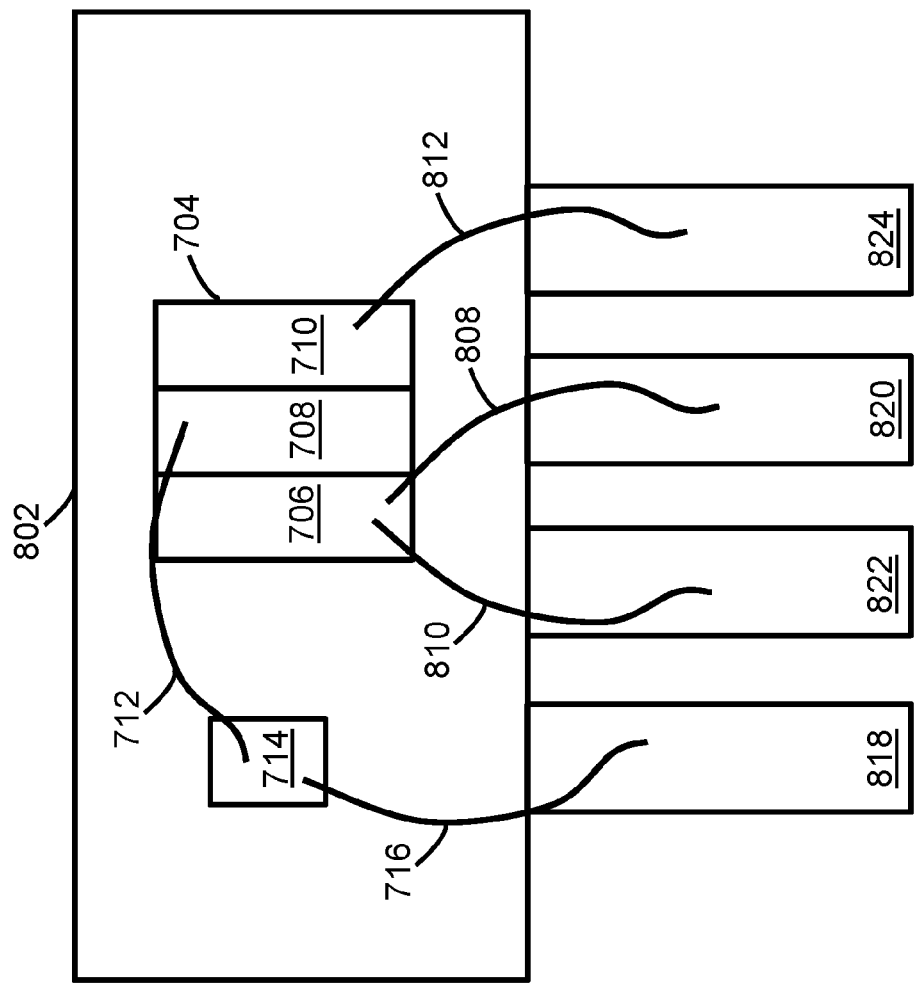
FIG. 10 is a schematic illustration of a switch which includes a III-N transistor encased in another electronic package having four package leads.

FIG. 10 is a schematic illustration of a switch which includes a III-N transistor 704 encased in another electronic package 802 having four package leads 818, 820, 822, and 824. Electronic packages are commonly produced with either three leads or five leads, so the package 802 can be fabricated with four leads by taking a five lead package and either breaking off the fifth lead or simply not using the fifth lead.

The gate 708 is coupled to the gate lead 818 by the ferrite bead 714, and the drain 710 is coupled (e.g., electrically connected) to the drain lead 824 by a wire bond 812. The source 706 is coupled (e.g., electrically connected) to the source lead 820 by a wire bond 808. The source 706 is also coupled (e.g., electrically connected) to an additional package lead 822 by a wire bond 810. Other types of connectors may also be used in place of the wire bonds. Having two package leads 820 and 822 for the source 706 can allow the switch to be more easily integrated into switching circuits in configurations that can lead to improved circuit performance. For example, referring to FIGS. 5 and 8, if the low side switch 108 and ferrite bead 210 are implemented as the device of FIG. 10, then the first package lead 820 for the source 706 can be coupled (e.g., electrically connected) to the ground node 110, and the second package lead 822 for the source 706 can be coupled (e.g., electrically connected) to the first terminal 206 of the gate driver 102.

The packaged III-N device 704 illustrated in FIGS. 6, 9, and 10 can be a single chip enhancement mode power transistor, e.g. a single chip III-N E-mode transistor. Alternatively, the packaged III-N device 704 can be a hybrid device that includes an enhancement mode transistor and a depletion mode transistor, as was illustrated in FIG. 4.

Figure 11:
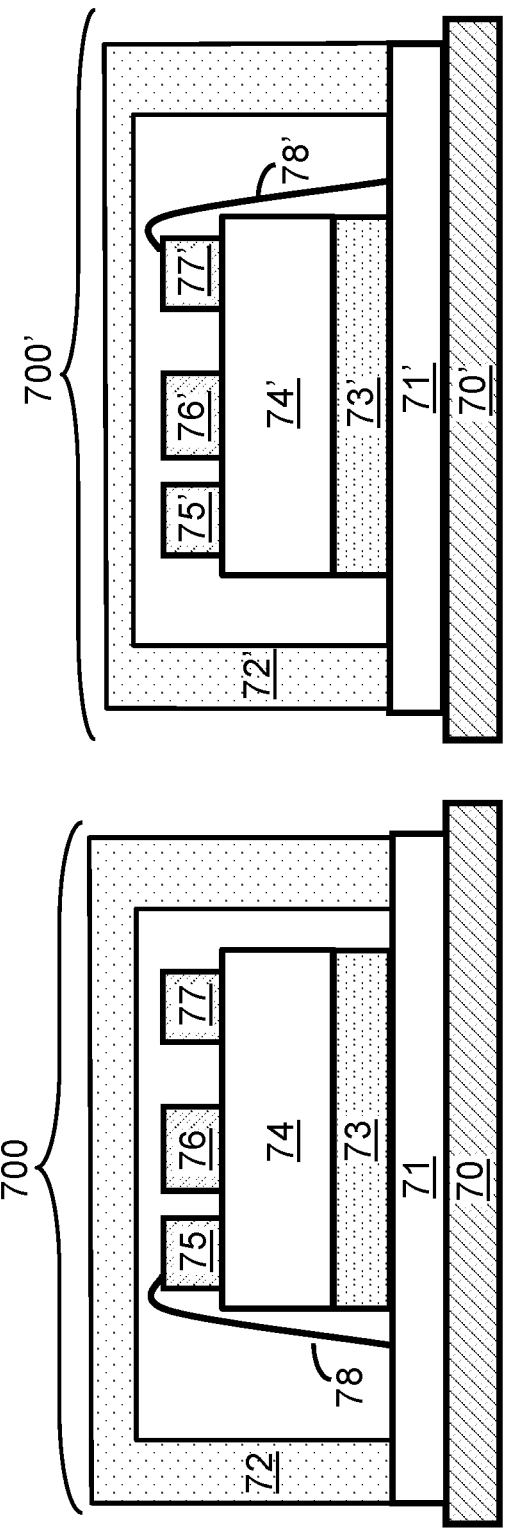
FIG. 11 is a schematic illustration of an example low side transistor and an example high side transistor that are implemented using electronic packages and can be used for the individually packaged low side and high side switches in FIGS. 5 and 8.

FIG. 11 is a schematic illustration of an example low side transistor 700 and an example high side transistor 700' that are implemented using electronic packages and can be used for the individually packaged low side and high side switches 108 and 104, respectively, in FIGS. 5 and 8. The transistors are lateral III-N devices. The low side transistor 700 package includes a heat sink 70, a conductive package base 71, and a case 72 that can be formed of an insulating material. Inside the package, the low side transistor 700 includes a substrate 73, a semiconductor body 74, a source electrode 75, a gate electrode 76, and a drain electrode 77. The source electrode is wire bonded to the conductive package base 71, which is in turn coupled (e.g., electrically connected) to a source package lead. The gate 76 is coupled (e.g., electrically connected) to a gate package lead and the drain 77 is coupled (e.g., electrically connected) to a drain package lead.

The high side transistor 700' also includes a heat sink 70', a conductive package base 71', and a case 72'. The high side transistor 700' includes a substrate 73', a semiconductor body 74', a source electrode 75', a gate electrode 76', and a drain electrode 77'. The drain electrode is wire bonded to the conductive package base 71', which is in turn coupled (e.g., electrically connected) to a drain package lead. The gate 76' is coupled (e.g., electrically connected) to a gate package lead and the source 75' is coupled (e.g., electrically connected) to a source package lead.

The transistors 700 and 700' can be used in a switching circuit, e.g., either of the switching circuits of FIGS. 5 and 8. For example, referring to FIG. 8, the low side transistor package 700 can be used as the package of the low side switch 108, and the high side transistor package 700' can be used as the package of the high side switch 104. Using the transistors 700 and 700' in this configuration can improve capacitive coupling in a switching circuit.

Figure 12:
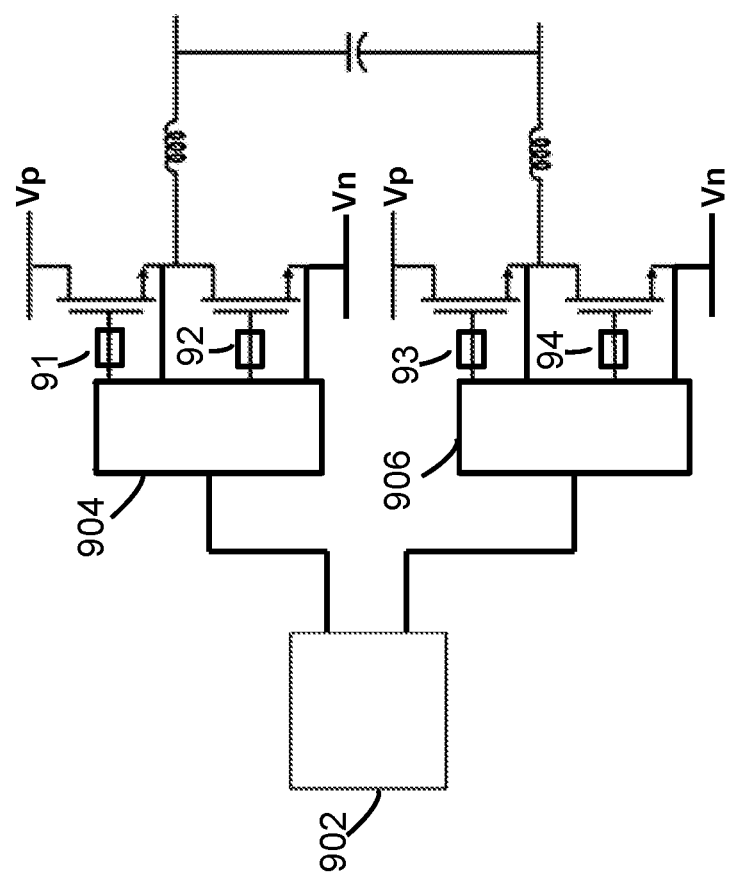
FIG. 12 is a circuit diagram of an example inverter circuit.

FIG. 12 is a circuit diagram of an example inverter. The inverter includes a microcontroller 902 and two half bridges comprising a first gate driver 904 and a second gate driver 906. The gate drivers 904 and 906 are coupled to respective gates of III-N devices, e.g., III-N transistors, by ferrite beads 91, 92, 93, and 94. The microcontroller 902 comprises a processor and a memory storing executable instructions that, when executed by the microcontroller, cause the microcontroller to operate each of the gate drivers 904 and 906 as gate drivers of a half bridge.

Figure 13:
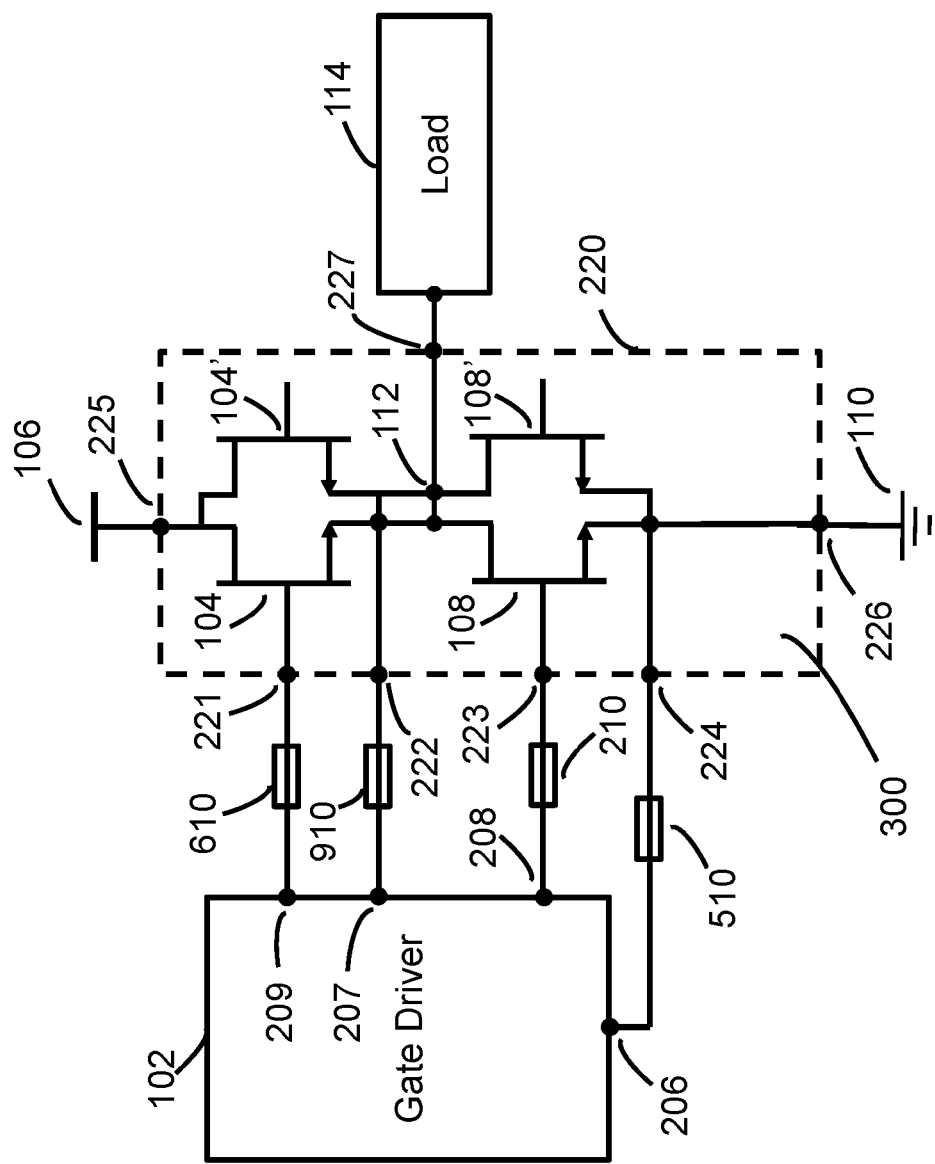
FIG. 13 is a circuit diagram of a switching circuit in which a portion of the circuit is implemented as an electronic module.

FIG. 13 is a circuit diagram of a switching circuit, where a portion of the circuit is again implemented as an electronic module 300, as in FIGS. 2 and 7. The electronic module 300 in FIG. 13 differs from the electronic module 200 of FIG. 7 in that the high side switch is implemented as a pair of switches 104 and 104' connected in parallel, and the low side switch is implemented as a pair of switches 108 and 108' connected in parallel. Many applications require larger load currents than can be supported by individual switches. Connecting two switches in parallel, as in FIG. 13, allows the maximum current that can be delivered to the load to be approximately double the current that can be delivered when a single switch is used for each of the high and low side switches, as in FIG. 7. Although not shown in FIG. 13, the high and low side switches can each include N switches connected in parallel, where N is an integer greater than 2. In this case, the maximum current that can be delivered to the load will be approximately N times the current that can be delivered when a single switch is used for each of the high and low side switches.

Although not shown in FIG. 13 for the sake of clarity, the gate of switch 104' is coupled to terminal 209 of the gate driver 102, and the gate of switch 108' is coupled to terminal 208 of the gate driver 102. This coupling may be achieved in a number of ways. For example, the gate of switch 104' can be connected to module node 221 and the gate of switch 108' can be connected to module node 223, such that ferrite bead 610 is shared by switches 104 and 104', and ferrite bead 210 is shared by switches 108 and 108'. Alternatively, the gates of switches 104' and 108' can each be connected to their own additional ferrite beads, with the opposite ends of the additional ferrite beads connected to gate driver terminals 209 and 208, respectively.

When half bridge switches are formed with parallel devices, as in FIG. 13, but without ferrite beads coupled to the gates of the switches, the half bridge switches tend to be very unstable during operation. Inclusion of the ferrite beads has been found to substantially increase the stability of these circuits. While providing each of the parallel devices with its own ferrite bead on its gate tends to result in more stable operation than when a single ferrite bead is shared by all the parallel devices, it is typically simpler to design and implement a module in which a single ferrite bead is shared by all the parallel devices.

As further seen in the circuit of FIG. 13, in addition to the ferrite beads 610 and 210 coupled between the gates of the high and low side switches and their respective gate driver terminals 209 and 208, ferrite beads 910 and 510 can also be coupled between the sources of the high and low side switches and their respective gate driver terminals 207 and 206. Ferrite beads 910 and 510 can furthermore be included between the sources of the switches and their respective gate driver terminals in any of the circuits described herein. Ferrite beads 910 and 510 can further improve the stability of half bridge circuits in which the switches are configured to support large voltages and/or currents and to operate at high frequencies, in particular when the switches are implemented as parallel devices, as in FIG. 13.

A number of implementations have been described. Nevertheless, it will be understood that various modifications may be made without departing from the spirit and scope of the techniques and devices described herein. For example, in the circuits in which the half bridge is provided as an electronic module, the ferrite beads may be included within or as part of the module. Accordingly, other implementations are within the scope of the following claims.

What is claimed is:

1. A circuit comprising:
an electronic module comprising a casing, the casing comprising a first node, a second node, a third node, a fourth node, and a fifth node;
a first III-N device enclosed in the casing of the electronic module, the first III-N device comprising a first drain, a first gate, and a first source, the first source coupled to the first node, and the first drain coupled to the third node;
a second III-N device enclosed in the casing of the electronic module, the second III-N device comprising a second drain, a second gate, and a second source, the second source coupled to the third node and the second drain coupled to the fifth node,;
a gate driver comprising a first terminal, a second terminal, a third terminal, and a fourth terminal, the first terminal being coupled to the electronic module at the first node, the third terminal being coupled to the electronic module at the third node, and the fourth terminal being coupled to the electronic module at the fourth node; and
a first ferrite bead coupled between the first gate of the first III-N device and the second terminal of the gate driver.

2. The circuit of claim 1, wherein the second terminal of the gate driver, the first ferrite bead, the first III-N device, the first node, and the first terminal are included in a gate loop; and wherein the first node has a parasitic inductance and the ferrite bead is configured to reduce oscillations and electromagnetic interference in the gate loop due to the parasitic inductance.

3. The circuit of claim 1, wherein
the first III-N device enclosed in the casing of the electronic module forms a low side switch,
the first node is coupled to a ground node,
the second III-N device enclosed in the casing of the electronic module forms a high side switch coupled to a high voltage node at the fifth node.

4. The circuit of claim 3, wherein the gate driver is configured to apply a low side control signal to the second terminal relative to the first terminal, and to apply a high side control signal to the fourth terminal relative to the third terminal of the gate driver.

5. The circuit of claim 3, comprising:
a processor coupled to the gate driver; and
memory storing executable instructions that, when executed by the processor, cause the processor to control the gate driver to operate the circuit as a half bridge.

6. The circuit of claim 3, wherein the voltage at the high voltage node relative to the ground node is about 400V or higher.

7. The circuit of claim 6, wherein the gate driver is configured to apply a control signal to the second terminal relative to the first terminal, the control signal having a frequency between 30 kHz and 10 MHz.

8. The circuit of claim 3, further comprising a second ferrite bead coupled between the second gate of the second III-N device and the fourth terminal of the gate driver.

9. The circuit of claim 1, wherein the gate driver is configured to apply a control signal to the second terminal relative to the first terminal, the control signal having a frequency between 30 kHz and 10 MHz.

10. The circuit of claim 1, wherein each of the first III-N device and the second III-N device is an enhancement mode transistor.

11. The circuit of claim 1, wherein each of the first III-N device and the second III-N device is a hybrid device comprising a depletion mode III-N transistor and an enhancement mode silicon transistor.

12. The circuit of claim 1, wherein the ferrite bead forms a passive low pass filter configured to block electromagnetic interference having frequencies above 100 MHz.

13. A circuit comprising:
a gate driver comprising first and second high side terminals and first and second low side terminals;
an electronic component package comprising a first lead, a second lead coupled to a high voltage node, and a third lead coupled to a load node, the first high side terminal of the gate driver being coupled to the electronic component package at the first lead, and the second high side terminal of the gate driver being coupled to the first electronic component package at the third lead;
a high side III-N device encased in the electronic component package, the high side III-N device comprising a high side gate, a high side drain coupled to the second lead, and a high side source coupled to the third lead;
the electronic component package comprising a fourth lead, and a fifth lead coupled to a ground node, the first low side terminal of the gate driver being coupled to the electronic component package at the fourth lead, and the second low side terminal of the gate driver being coupled to the electronic component package at the fifth lead;
a low side III-N device encased in the electronic component package, the low side III-N device comprising a low side gate coupled to the fourth lead, a low side drain coupled to the third lead, and a low side source coupled to the fifth lead;
a first ferrite bead coupled between the low side gate and the first low side terminal of the gate driver; and
a second ferrite bead coupled between the high side gate and the first high side terminal of the gate driver.

14. The circuit of claim 13, comprising:
a processor coupled to the gate driver; and memory storing executable instructions that, when executed by the processor, cause the processor to control the gate driver to operate the circuit as a half bridge.

15. The circuit of claim 13, wherein during operation of the circuit, the voltage at the high voltage node relative to the ground node is at least 400V.

16. The circuit of claim 13, wherein the gate driver is configured to apply control signals to the first high side terminal relative to the second high side terminal and to the first low side terminal relative to the second terminal, the control signals having a frequency between 30 kHz and 10 MHz.

17. The circuit of claim 13, wherein the high side III-N device comprises a III-N enhancement mode transistor.

18. The circuit of claim 13, wherein the high side III-N device is a hybrid device comprising a depletion mode III-N transistor and an enhancement mode silicon transistor.

19. The circuit of claim 13, wherein the ferrite bead forms a passive low pass filter configured to block electromagnetic interference having frequencies above 100 MHz.

20. A circuit comprising:
an electronic component package comprising at first lead, a second lead, and a third lead;
a III-N device encased in the electronic component package, the III-N device comprising an enhancement mode transistor, the enhancement mode transistor comprising a drain, a gate, and a source, the source coupled to the first lead, and the drain coupled to the third lead;
a gate driver comprising a first terminal and a second terminal, the first terminal being coupled to the second lead of the electronic component package, and the second terminal being coupled to the first lead; and
a ferrite bead encased in the electronic component package and coupled between the gate of the enhancement mode transistor and the second lead.

21. The circuit of claim 20, wherein the electronic package further comprising a conductive structural base, wherein the enhancement mode transistor is a lateral III-N transistor, the source of the III-N transistor is electrically connected to the conductive structural base of the electronic package, and the conductive structural base is directly coupled to the first lead.

22. The circuit of claim 20, wherein the first terminal of the gate driver, the ferrite bead, the III-N device, and the first lead form a gate loop, the first lead has a parasitic inductance, and the ferrite bead is configured to reduce oscillations and electromagnetic interference in the gate loop due to the parasitic inductance.

23. The circuit of claim 20, wherein the III-N device and the electronic component package form a low side switch, the first lead is coupled to a ground node, and the circuit further comprises a high side switch coupled between the third lead and a high voltage node, the high side switch comprising a high side gate coupled to a third terminal of the gate driver.

24. The circuit of claim 23, comprising:
a processor coupled to the gate driver; and
memory storing executable instructions that, when executed by the processor, cause the processor to control the gate driver to operate the circuit as a half bridge.

25. The circuit of claim 23, wherein
the gate driver is configured to apply a low side control signal to the first terminal relative to the second terminal, and to apply a high side control signal to the third terminal relative to a fourth terminal of the gate driver, the fourth terminal being coupled to a high side source of the high side switch.

26. The circuit of claim 25, wherein the voltage at the high voltage node relative to the ground node is about 400V or higher.

27. The circuit of claim 26, wherein the gate driver is configured to apply a control signal to the first terminal relative to the second terminal, the control signal having a frequency between 30 kHz and 10 MHz.

28. The circuit of claim 23, further comprising a second ferrite bead coupled between the high side gate and the third terminal of the gate driver.

29. The circuit of claim 20, wherein the ferrite bead forms a passive low pass filter configured to block electromagnetic interference having frequencies above 100 MHz.

* * * * *